United States Patent
Bera

(10) Patent No.: US 9,711,330 B2
(45) Date of Patent: *Jul. 18, 2017

(54) RF MULTI-FEED STRUCTURE TO IMPROVE PLASMA UNIFORMITY

(71) Applicant: Applied Materials, Inc., Santa Clara, CA (US)

(72) Inventor: Kallol Bera, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/150,968

(22) Filed: May 10, 2016

(65) Prior Publication Data

US 2016/0254124 A1    Sep. 1, 2016

Related U.S. Application Data

(63) Continuation of application No. 14/215,563, filed on Mar. 17, 2014, now Pat. No. 9,336,997.

(51) Int. Cl.
*H01J 7/24* (2006.01)
*H01J 37/32* (2006.01)

(52) U.S. Cl.
CPC .......... *H01J 37/32128* (2013.01); *H01J 7/24* (2013.01); *H01J 37/32091* (2013.01); *H01J 37/32174* (2013.01); *H01J 37/32541* (2013.01); *H01J 37/32577* (2013.01); *H01J 2237/3321* (2013.01)

(58) Field of Classification Search
CPC .................................. H01J 7/24; H01J 37/32
USPC .................. 315/111.21, 111.41, 111.71, 326
See application file for complete search history.

(56) References Cited

U.S. PATENT DOCUMENTS

| 5,186,718 | A | 2/1993 | Tepman | |
|---|---|---|---|---|
| 5,210,466 | A | * 5/1993 | Collins | C23C 16/509 156/345.44 |
| 5,646,489 | A | * 7/1997 | Kakehi | C23C 16/511 118/723 ME |
| 5,685,941 | A | 11/1997 | Forster | |
| 6,132,566 | A | 10/2000 | Hofmann | |
| 6,149,784 | A | 11/2000 | Su | |
| 6,176,981 | B1 | 1/2001 | Hong | |
| 6,190,513 | B1 | 2/2001 | Forster | |
| 6,203,620 | B1 | 3/2001 | Moslehi | |
| 6,228,229 | B1 | 5/2001 | Raaijmakers | |
| 6,264,812 | B1 | 7/2001 | Raaijmakers | |
| 6,297,595 | B1 | 10/2001 | Stimson | |
| 6,461,483 | B1 | 10/2002 | Gopalraja | |
| 6,486,431 | B1 | 11/2002 | Smith | |
| 6,565,717 | B1 | 5/2003 | Leet | |
| 6,632,324 | B2 | 10/2003 | Chan | |

(Continued)

FOREIGN PATENT DOCUMENTS

JP    2012074459 A    4/2012

OTHER PUBLICATIONS

PCT International Search Report and Written Opinion in PCT/US2015/020923, mailed Jun. 26, 2015, 10 pages.

(Continued)

*Primary Examiner* — Tung X Le
(74) *Attorney, Agent, or Firm* — Servilla Whitney LLC

(57) ABSTRACT

A plasma source assembly for use with a processing chamber is described. The assembly includes a multi-feed RF power connection to a single or multiple RF hot electrodes.

20 Claims, 10 Drawing Sheets

(56) References Cited

U.S. PATENT DOCUMENTS

| | | |
|---|---|---|
| 6,707,255 B2 | 3/2004 | Coumou |
| 6,815,633 B1 | 11/2004 | Chen |
| 7,102,292 B2 | 9/2006 | Parsons |
| 7,396,431 B2 | 7/2008 | Chen |
| 8,040,068 B2 | 10/2011 | Coumou |
| 8,884,523 B2 | 11/2014 | Winterhalter |
| 2003/0137250 A1 | 7/2003 | Mitrovic |
| 2003/0216037 A1 | 11/2003 | Zhang |
| 2004/0159287 A1 | 8/2004 | Hoffman |
| 2004/0194890 A1 | 10/2004 | Moroz |
| 2005/0167263 A1 | 8/2005 | Chistyakov |
| 2006/0065367 A1 | 3/2006 | Chen |
| 2007/0212896 A1 | 9/2007 | Olsen |
| 2008/0044960 A1 | 2/2008 | A-Bayati |
| 2008/0099426 A1 | 5/2008 | Kumar |
| 2011/0180213 A1 | 7/2011 | Hirayama |
| 2012/0073757 A1 | 3/2012 | Yamazawa |

OTHER PUBLICATIONS

PCT International Preliminary Report on Patentability in PCT/US2015/020923 dated Sep. 20, 2016, 7 pages.

* cited by examiner

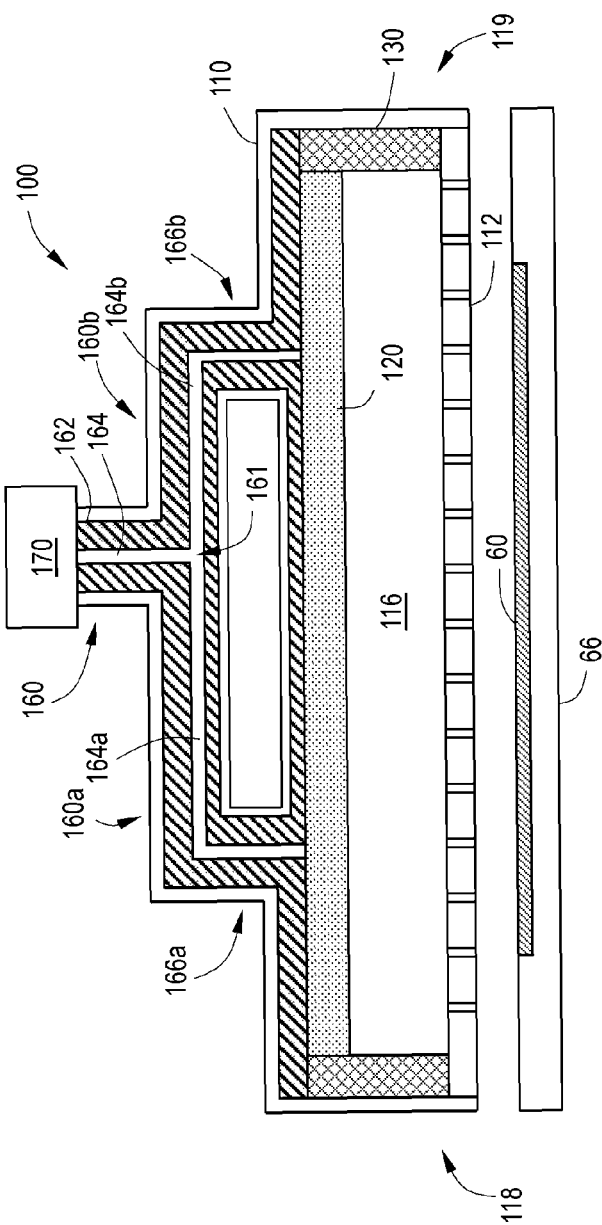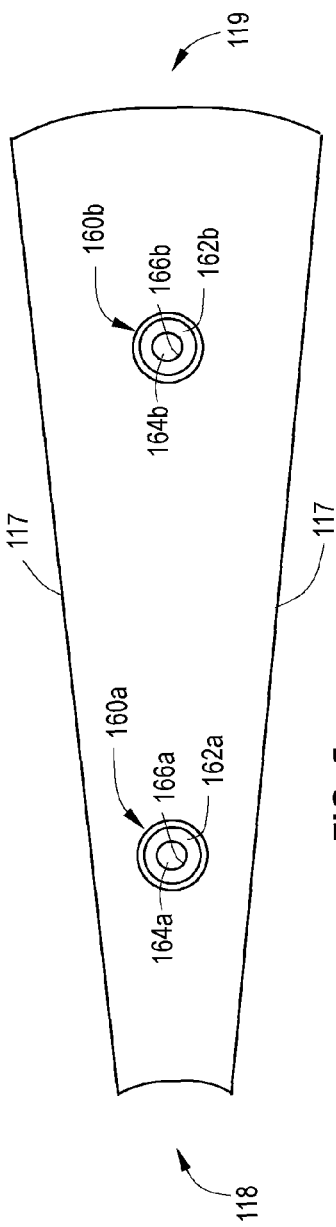
FIG. 4
FIG. 5

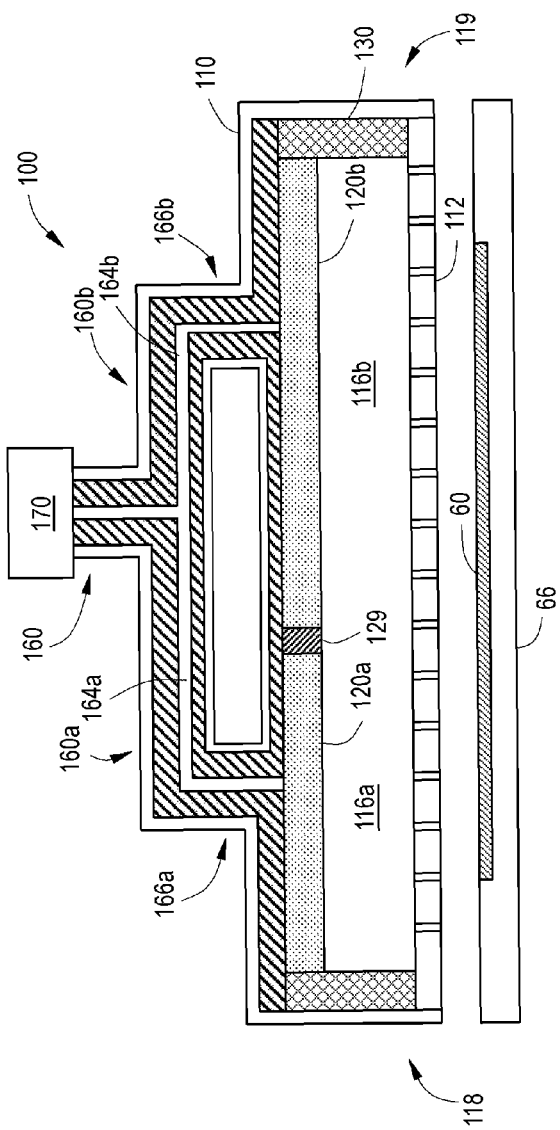
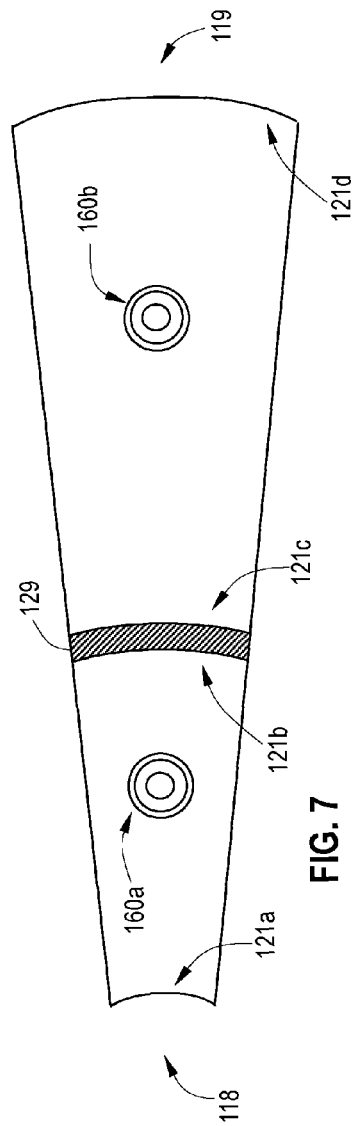
FIG. 6
FIG. 7

RF MULTI-FEED STRUCTURE TO IMPROVE PLASMA UNIFORMITY

CROSS-REFERENCE TO RELATED APPLICATIONS

This application is a continuation of U.S. patent application Ser. No. 14/215,563, filed Mar. 17, 2014, the entire disclosure of which is hereby incorporated by reference herein.

BACKGROUND

Embodiments of the disclosure generally relate to an apparatus for processing substrates. More particularly, embodiments of the disclosure relate to modular capacitively coupled plasma sources for use with processing chambers including batch processors.

Semiconductor device formation is commonly conducted in substrate processing systems or platforms containing multiple chambers, which may also be referred to as cluster tools. In some instances, the purpose of a multi-chamber processing platform or cluster tool is to perform two or more processes on a substrate sequentially in a controlled environment. In other instances, however, a multiple chamber processing platform may only perform a single processing step on substrates. The additional chambers can be employed to maximize the rate at which substrates are processed. In the latter case, the process performed on substrates is typically a batch process, wherein a relatively large number of substrates, e.g. 25 or 50, are processed in a given chamber simultaneously. Batch processing is especially beneficial for processes that are too time-consuming to be performed on individual substrates in an economically viable manner, such as for atomic layer deposition (ALD) processes and some chemical vapor deposition (CVD) processes.

The effectiveness of a substrate processing platform is often quantified by cost of ownership. The cost of ownership, while influenced by many factors, is largely affected by the system footprint, i.e., the total floor space required to operate the system in a fabrication plant, and system throughput, i.e., the number of substrates processed per hour. The footprint typically includes access areas adjacent the system that are required for maintenance. Hence, although a substrate processing platform may be relatively small, if it requires access from all sides for operation and maintenance, the system's effective footprint may still be prohibitively large.

Capacitively coupled plasma is used to deposit thin films or to treat films that have been deposited. Plasma non-uniformity can result in non-uniformity of the deposited films. Therefore, there is a need in the art to provide apparatus, systems and methods that improve plasma uniformity in modular capacitively coupled plasma sources for use with batch reactors.

SUMMARY

One or more embodiments of the disclosure are directed to plasma source assemblies comprising a pie-shaped housing and a pie-shaped RF hot electrode. The pie-shaped housing has an inner peripheral edge, an outer peripheral edge and side walls. The housing includes an electrically grounded front face. The inner peripheral edge and outer peripheral edge define a length and the sides walls defined a width. The width increases along the length from the inner peripheral edge to the outer peripheral edge. The pie-shaped RF hot electrode is within the housing and is spaced from the electrically grounded front face defining a gap. An end dielectric bounds the pie-shaped RF hot electrode at the inner peripheral edge, the outer peripheral edge and the side walls and is positioned between the RF hot electrode and the housing. A first coaxial RF feed line including an outer conductor and an inner conductor separated by an insulator. The outer conductor is in communication with electrical ground and the inner conductor is in electrical communication with the RF hot electrode. The first coaxial RF feed line connects to the RF hot electrode at a first distance from the inner peripheral edge of the housing. A second coaxial RF feed line including an outer conductor and an inner conductor separated by an insulator. The outer conductor is in communication with electrical ground and the inner conductor is in electrical communication with the RF hot electrode. The second coaxial RF feed line connects to the RF hot electrode at a second distance from the inner peripheral edge of the housing, the second distance being greater than the first distance.

Additional embodiments of the disclosure are directed to plasma source assemblies comprising a housing, an RF hot electrode, an end dielectric and an RF feed line. The housing includes an inner peripheral edge, an outer peripheral edge, two side walls connecting the inner peripheral edge and the outer peripheral edge and an electrically grounded front face comprising a plurality of openings therethrough. The RF hot electrode is within the housing and has a body with a front surface, a back surface, sides, a first end adjacent the inner peripheral edge and a second end adjacent the outer peripheral edge. The front surface of the RF hot electrode spaced from the grounded front face of the housing to form a gap. The end dielectric is in contact with each of the first end, the second end and the sides of the RF hot electrode and is positioned between the RF hot electrode and the housing. The RF feed line includes an outer conductor and an inner conductor separated by an insulator. The RF feed line splits at a junction into a first RF feed line and a second RF feed line. The first RF feed line is in electrical communication with the RF hot electrode at a first distance from the inner peripheral edge of the housing. The second RF feed line is in electrical communication with the RF hot electrode at a second distance from the inner peripheral edge of the housing. The second distance greater than the first distance.

Further embodiments of the disclosure are directed to modular plasma source assemblies comprising a wedge-shaped elongate housing, an RF hot electrode, an end dielectric, an RF feed line, a first RF feed line and a second RF feed line. The wedge-shaped elongate housing has an inner peripheral edge, an outer peripheral edge, two side walls connecting the inner peripheral edge and the outer peripheral edge and an electrically grounded front face comprising a plurality of openings therethrough. The length is defined by the inner peripheral edge and outer peripheral edge and the width defined by the two side walls. The width increases from the inner peripheral edge to the outer peripheral edge. The RF hot electrode is within the housing and has a body with a front surface, a back surface, elongate sides, a first end adjacent the inner peripheral edge and a second end adjacent the outer peripheral edge of the housing. The front surface of the RF hot electrode is spaced from the front face of the housing to form a gap. The end dielectric is in contact with each of the first end, the second end and the sides of the RF hot electrode positioned between the RF hot electrode and the housing. The RF feed line has an outer conductor and an inner conductor separated by an insulator.

The RF feed line is in communication with a power source and a junction. The first RF feed line extends a first length from the junction to the RF hot electrode. The first RF feed line has an outer conductor and an inner conductor separated by an insulator. The outer conductor is in electrical communication with ground and the inner conductor is in electrical communication with the RF hot electrode and spaced a first distance from the inner peripheral edge of the housing. The second RF feed line extends a second length from the junction to the RF hot electrode. The second RF feed line has an outer conductor and an inner conductor separated by an insulator. The outer conductor is in electrical communication with ground and the inner conductor in electrical communication with the RF hot electrode and is spaced a second distance from the inner peripheral edge of the housing. The second distance being greater than the first distance.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 4 shows a cross-sectional view of a plasma source assembly in accordance with one or more embodiments of the disclosure;

FIG. 5 shows a top plan view of a plasma source assembly in accordance with the embodiment of FIG. 4;

FIG. 6 shows a cross-sectional view of a plasma source assembly in accordance with one or more embodiments of the disclosure;

FIG. 7 shows a top plan view of a plasma source assembly in accordance with the embodiment of FIG. 6;

DETAILED DESCRIPTION

Figure 1:
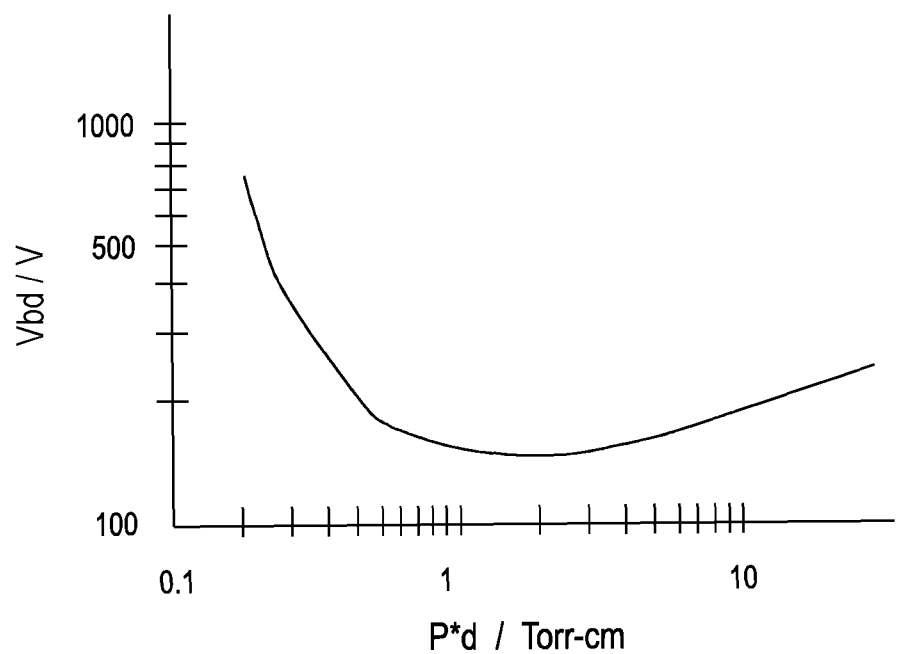
FIG. 1 shows the Paschen curve for argon.

Embodiments of the disclosure provide a substrate processing system for continuous substrate deposition to maximize throughput and improve processing efficiency. The substrate processing system can also be used for pre-deposition and post-deposition plasma treatments.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

As used in this specification and the appended claims, the terms "reactive gas", "precursor", "reactant", and the like, are used interchangeably to mean a gas that includes a species which is reactive with a substrate surface. For example, a first "reactive gas" may simply adsorb onto the surface of a substrate and be available for further chemical reaction with a second reactive gas.

Rotating platen chambers are being considered for many applications. In such a chamber, one or more wafers are placed on a rotating holder ("platen"). As the platen rotates, the wafers move between various processing areas. For example, in ALD, the processing areas would expose the wafer to precursor and reactants. In addition, plasma exposure may be necessary to properly treat the film or the surface for enhanced film growth, or to obtain desirable film properties. Some embodiments of the disclosure provide for uniform deposition and post-treatment (e.g., densification) of ALD films when using a rotating platen ALD chamber.

Rotating platen ALD chambers can deposit films by traditional time-domain processes where the entire wafer is exposed to a first gas, purged and then exposed to the second gas, or by spatial ALD where portions of the wafer are exposed to the first gas and portions are exposed to the second gas and the movement of the wafer through these gas streams deposits the layer.

Embodiments of the disclosure can be used with either a linear processing system or a rotational processing system. In a linear processing system, the width of the area that the plasma exits the housing is substantially the same across the entire length of front face. In a rotational processing system, the housing may be generally "pie-shaped" or "wedge-shaped". In such a pie-shaped or wedge-shaped housing, the plasma that exits the housing generally conforms to the pie shape. As used in this specification and the appended claims, the terms "pie-shaped" and "wedge-shaped" are used interchangeably to describe a body that is a generally circular sector. For example, a wedge-shaped segment may be a fraction or portion of a circle or disc-shaped object. In some embodiments, the fraction or portion defines an arc less than 180 degrees, more specifically, less than 135 degrees and most specifically less than 90 degrees. In particular embodiments, the pie-shaped or wedge-shaped sectors define an arc of 90, 85, 80, 75, 70, 65, 60, 55, 50, 45, 40, 35, 30, 25, 20, or 15 degrees. The inner edge of the pie-shaped segment can terminate at a point or can be truncated to a flat edge or rounded. Similarly, the outer edge of the pie-shaped segment can be straight or curved. The path of the substrates can be perpendicular to the gas ports. In some embodiments, each of the gas injector assemblies comprises a plurality of elongate gas ports which extend in a direction substantially perpendicular to the path traversed by a substrate. As used in this specification and the appended claims, the term "substantially perpendicular" means that the general direction of movement of the substrates is along a plane approximately perpendicular (e.g., about 45° to 90°) to the axis of the gas ports. For a wedge-shaped gas port, the axis of the gas port can be considered to be a line defined as the mid-point of the width of the port extending along the length of the port.

Embodiments of the disclosure are directed to capacitively coupled plasma technology with narrow RF electrodes which can be pie-shaped (also called wedge-shaped). In process data, high wet etch rate (low deposition rate) of ALD films are observed at RF feed locations that changes with distance from the feed location. This can lead to non-uniformity in the ALD film properties. Low plasma density and ion flux at RF feed locations are found to increase away from the feed location. Without being bound by any particular theory of operation, it is believed that this is caused by an increase in electric field away from the feed location. Increase in electric field increases power deposition that increases plasma density, hence ion flux. Moving the feed location moves the location of low ion flux, process non-uniformity remains.

In some embodiments of the disclosure, the RF feed from the source is divided into multiple feeds that connect to the single powered electrode. With multiple feeds, the furthest distance away from the feed locations is shortened and the electric field becomes more uniform. The plasma density, and ion flux to the wafer, becomes more uniform. In one or more embodiments, a dielectric break can be used to split the powered electrode. Feed from multi-feed structures can be connected to each segment of the split powered electrodes.

One or more embodiments of the disclosure include a power and/or phase controller to multi-feed structure to powered electrodes. The power and/or phase to each segment of the power electrode can be controlled in order to further improve plasma uniformity, hence ion flux and process uniformity. There can be any number of feeds with multiple levels of split feed.

Figure 2:
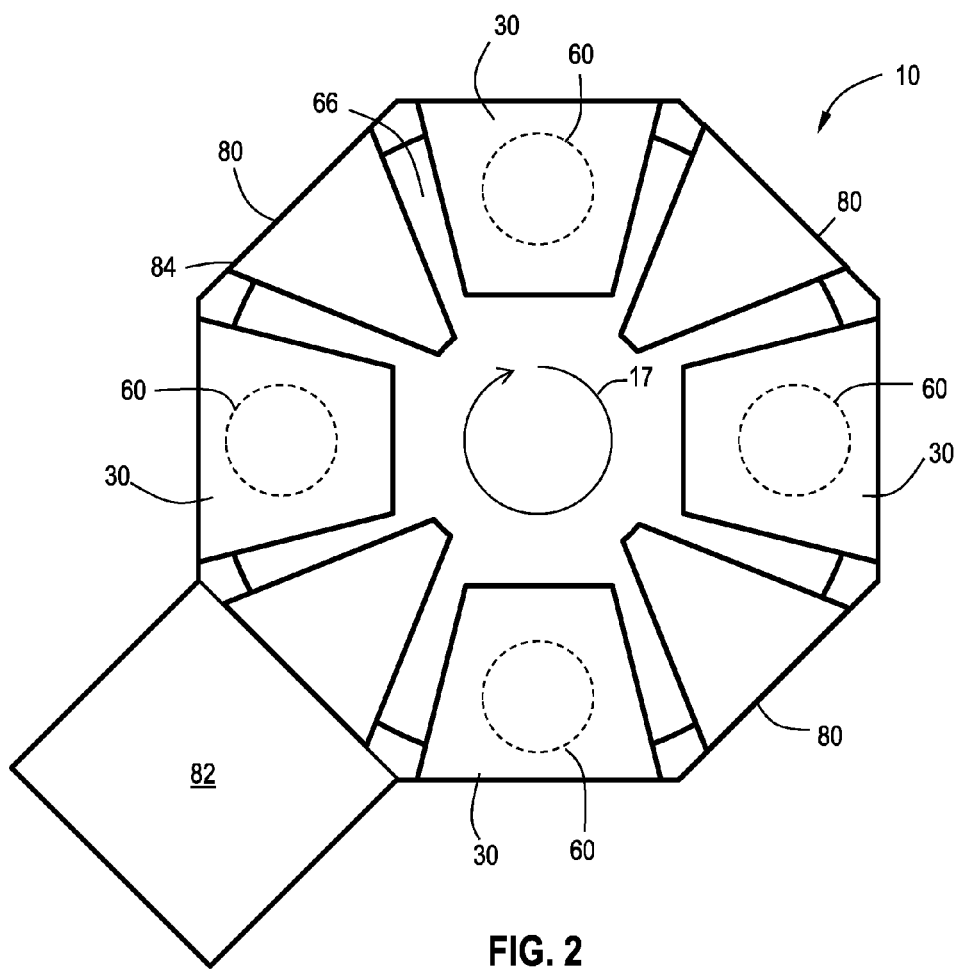
FIG. 2 shows a schematic plan view of a substrate processing system configured with four gas injector assemblies and four capacitively coupled pie-shaped plasma sources with a loading station in accordance with one or more embodiments of the disclosure.

Processing chambers having multiple gas injectors can be used to process multiple wafers simultaneously so that the wafers experience the same process flow. For example, as shown in FIG. 2, the processing chamber 10 has four gas injector assemblies 30 and four wafers 60. At the outset of processing, the wafers 60 can be positioned between the injector assemblies 30. Rotating the susceptor 66 of the carousel by 45° will result in each wafer 60 being moved to an injector assembly 30 for film deposition. An additional 45° rotation would move the wafers 60 away from the injector assemblies 30. This is the position shown in FIG. 2. With spatial ALD injectors, a film is deposited on the wafer during movement of the wafer relative to the injector assembly. In some embodiments, the susceptor 66 is rotated so that the wafers 60 do not stop beneath the injector assemblies 30. The number of wafers 60 and gas injector assemblies 30 can be the same or different. In some embodiments, there is the same number of wafers being processed as there are gas injector assemblies. In one or more embodiments, the number of wafers being processed are an integer multiple of the number of gas injector assemblies. For example, if there are four gas injector assemblies, there are 4X wafers being processed, where X is an integer value greater than or equal to one.

The processing chamber 10 shown in FIG. 2 is merely representative of one possible configuration and should not be taken as limiting the scope of the disclosure. Here, the processing chamber 10 includes a plurality of gas injector assemblies 30. In the embodiment shown, there are four gas injector assemblies 30 evenly spaced about the processing chamber 10. The processing chamber 10 shown is octagonal, however, it will be understood by those skilled in the art that this is one possible shape and should not be taken as limiting the scope of the disclosure. The gas injector assemblies 30 shown are wedge-shaped but it will be understood by those skilled in the art that the gas injector assemblies can be rectangular, or have other shapes. An option for a plasma source is capacitively coupled plasma. Such plasmas have high plasma density and low plasma potentials. A capacitively coupled plasma is generated via RF currents in conductors. The RF carrying conductors may be separated from the plasma via a dielectric window, thereby minimizing the possibility of metallic contamination of the film.

The processing chamber 10 includes a substrate support apparatus, shown as a round susceptor 66 or susceptor assembly or platen. The substrate support apparatus, or susceptor 66, is capable of moving a plurality of wafers 60 beneath each of the gas injector assemblies 30. A load lock 82 might be connected to a side of the processing chamber 10 to allow the wafers 60 to be loaded and/or unloaded from the chamber 10.

In some embodiments, the processing chamber 10 comprises a plurality of gas curtains (not shown) positioned between the gas injector assemblies 30 (also called gas distribution plates or gas distribution assemblies) and the plasma sources 80. Each gas curtain creates a barrier to prevent, or minimize, diffusion of processing gases into other regions of the processing chamber. For example, a gas curtain can prevent or minimize the diffusion of reactive gases from gas injector assemblies 30 from migrating from the gas distribution assembly regions to the plasma source 80 regions and vice versa. The gas curtain can include any suitable combination of gas and/or vacuum streams which can isolate the individual processing sections from the adjacent sections. In some embodiments, the gas curtain is a purge (or inert) gas stream. In one or more embodiments, the gas curtain is a vacuum stream that removes gases from the processing chamber. In some embodiments, the gas curtain is a combination of purge gas and vacuum streams so that there are, in order, a purge gas stream, a vacuum stream and a purge gas stream. In one or more embodiments, the gas curtain is a combination of vacuum streams and purge gas streams so that there are, in order, a vacuum stream, a purge gas stream and a vacuum stream.

Some atomic layer deposition systems require a modular plasma source, i.e. a source that can be easily inserted into the system. Such a source will have all or most of its hardware operating at the same pressure level as the atomic layer deposition process, typically 1-100 Torr. Briefly, the plasma source according to one or more embodiments includes a main RF feed that is held at atmospheric pressure. This eliminates possibility of spurious plasma ignition in the coaxial feed. The RF hot electrode creates the desired plasma in an 8.5 mm gap (the gap can range from 2 mm or 3 mm to 25 mm) between said hot electrode and a grounded electrode or grounded front face or face plate.

The upper portion of the electrode is covered by a thick dielectric (e.g., ceramic), which in turn is covered by a grounded surface. The RF hot electrode and grounded structure are made of a good conductor, such as aluminum. To accommodate thermal expansion, two pieces of dielectric (e.g. ceramic) are placed at one or more of the long ends of the RF hot electrode. A grounded component may be placed adjacent to the dielectric, without a gap between. The grounded pieces can slide inside the structure and may be held against the dielectric with springs or some compression mechanism to hold the parts together, eliminating gaps, yet still allows some sliding due to thermal expansion. The springs compress the entire "sandwich" of grounded component/dielectric against the RF hot electrode without any gaps, thereby eliminating or minimizing the chance of spurious plasma.

The coaxial RF feed may be constructed so that the outer conductor terminates on the grounded plate. The inner conductor can terminate on the RF hot electrode. Since the feed is at atmospheric pressure, there may be O-rings at the bottom of the feed structure to enable medium pressure inside the source. Gas can be fed to the source around the outside periphery of the coaxial feed.

In some embodiments, the holes in the RF hot electrode have a diameter less than 2 mm, 1 mm or 0.5 mm, and these holes permit gas to pass through the electrode to the gap. In one or more embodiments, holes in the front face have a diameter less than about 7 mm. The holes in the front face are sized so that a plasma is ignited in either substantially all (>90%) or substantially none (<10%) of the holes. The size of the holes should be sized to prevent ignition inside the holes for the hot electrode.

The RF feed may be in the form of a coaxial transmission line. The outer conductor is connected/terminated in a grounded plate, and the inner conductor is connected to the RF hot plate. The grounded plate can be connected to the metal enclosure or housing by any suitable method including, but not limited to, a metal gasket. This helps to ensure a symmetric geometry of the return currents. All return currents flow up the outer conductor of the feed to minimize RF noise. The ground connection can be, for example, a ground plane 195 (shown in FIG. 11A), a plate or cylindrical conduit.

Figure 3:
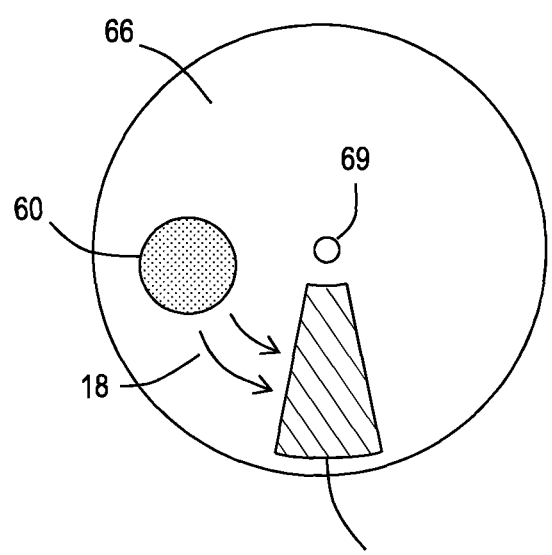
FIG. 3 shows a schematic of a platen rotating a wafer through a pie-shaped plasma region in accordance with one or more embodiments of the disclosure.

The plasma source of one or more embodiments can be wedge-shaped, round, square, rectangular or other shape. For a spatial ALD application utilizing a rotating wafer platen, the shape may be a truncated wedge, as shown in FIG. 3.

FIG. 4 shows a plasma source assembly in accordance with one or more embodiments of the disclosure. The plasma source assembly 100 includes a pie-shaped housing 110 with an inner peripheral edge 118, an outer peripheral edge 119 and side walls 117. The housing 110 includes an electrically grounded front face 112. The inner peripheral edge 118 and outer peripheral edge 119 define a length L and the side walls 117 define a width W. Looking at FIG. 5, it can be easily seen that the width increases along the length from the inner peripheral edge 118 to the outer peripheral edge 119. The housing 110 of some embodiments is connected to electrical ground. References to the inner peripheral edge and outer peripheral edge are not limited to the dimensional extremes of the component. These references can also refer to the area immediately adjacent the edge and may also be referred to as the inner peripheral end or outer peripheral end, respectively.

An RF hot electrode 120 is located within the housing 110. The RF hot electrode 120 can have any suitable shape such as rectangular or pie-shaped. In one or more embodiments, the RF hot electrode 120 is pie-shaped. The RF hot electrode 120 does not directly contact the housing 110 to prevent unintentionally grounding the RF hot electrode 120. As shown in FIG. 4, the RF hot electrode 120 is spaced from the electrically grounded front face 112 and defining a gap 116. Coupling between the RF hot electrode 120 and the front face 112 generates a plasma in the gap 116.

The RF hot electrode 120 can be made from any suitable conductive material. The material used should not be reactive with the gases flowing into the gap 116. In some embodiments, the RF hot electrode 120 comprises one or more of aluminum, stainless steel, copper, titanium, tungsten and combinations thereof.

One or more end dielectrics 130 bound the elongate RF hot electrode 120 at the inner peripheral edge 118, the outer peripheral edge 119 and the side edge 117. The end dielectrics 130 are positioned between the RF hot electrode 120 and the housing 110 to prevent unintentionally grounding the RF hot electrode 120. The end dielectric 130 can be made from any suitable material capable of preventing electrical contact between the RF hot electrode 120 and the housing 110. In some embodiments, the end dielectric 130 is made from a material comprising ceramic, aluminum oxide, aluminum nitride, plastic and combinations thereof.

A coaxial feed line 160 connects a power source 170 to the RF hot electrode 120. The coaxial feed line 160 includes an outer conductor 162 and an inner conductor 164. The outer conductor 162 and inner conductor 164 are separated by an insulator 166 which prevents the electrical contact between the outer conductor and the inner conductor.

The coaxial feed line 160 of FIG. 4 splits into a first coaxial RF feed line 160*a* and a second coaxial RF feed line 160*b*. Although the coaxial feed line 160 is shown splitting into two lines at junction 161, it will be understood that the number of feed lines can be greater than two. The first coaxial RF feed line 160*a* includes an outer conductor 162*a* and an inner conductor 164*a*. The outer conductor 162*a* is in electrical contact with ground and the inner conductor 164*a* is in electrical communication with the RF hot electrode 120. The second coaxial RF feed line 160*b* includes an outer conductor 162*a* and an inner conductor 164*b*. The outer conductor 162*b* is in electrical contact with ground and the inner conductor 164*b* is in electrical communication with the RF hot electrode 120.

Referring to FIG. 4, the first coaxial RF feed line 160*a* connects to the RF hot electrode at a first distance from the inner peripheral edge 118 of the housing 110 and the second coaxial RF feed line 160*b* connects to the RF hot electrode at a second distance from the inner peripheral edge 118 that is different from the first distance.

FIG. 5 shows a top view of a plasma source assembly in accordance with the embodiment of FIG. 4. It can be seen that the first coaxial RF feed line 160*a* connects to the RF hot electrode 120 at a position closer to the inner peripheral edge 118 than the second coaxial RF feed line 160*b*. Both of the feed lines are shown connecting to the electrode at a position in about the middle of the width of the housing. However, the position of these connections can be modified depending on, for example, the number of individual feed lines, the power of each feed line and the phase of each feed line.

The length of the first coaxial RF feed line 160a and the second coaxial RF feed line 160b can be the same or different. As used in this regard, the length of the first coaxial feed line and the second coaxial feed line are measured from the junction 161 to the point where the inner conductor connects to the RF hot electrode. In some embodiments, the length of the first coaxial feed line 160a is greater than the length of the second coaxial feed line 160b. The ratio of the length of the first coaxial feed line 160a to the length of the second coaxial feed line 160b is in the range of about 10:1 to about 1:5, or in the range of about 8:1 to about 1:3, or in the range of about 6:1 to about 1:1.

Referring now to FIGS. 6 and 7, another embodiment of the disclosure has an RF hot electrode split into two regions, an inner peripheral region 120a and an outer peripheral region 120b. The length of each of the regions can be changed so long as there is electrical isolation between the regions. For example, if there are two regions, then there is a single break in continuity or can have an intermediate dielectric 129. The dielectric 129 can be made of any suitable material that can provide electrical isolation between the inner peripheral region and the outer peripheral region. For example, the dielectric can comprise a ceramic, aluminum oxide, aluminum nitride, plastic and combinations thereof.

The first coaxial feed line 160a connects to the inner peripheral region 120a and the second coaxial feed line 160b connects to the outer peripheral region 120b. While two regions and two coaxial feed lines are shown, it will be understood that there can be more than two regions with at least one coaxial feed line connected to each. In some embodiments, there are three regions and at least three coaxial feed lines. In some embodiments there are two inner peripheral regions side by side and a single outer peripheral region.

The inner RF hot electrode 120a has a first end 121a adjacent the inner peripheral edge 118 of the housing 110 and a second end 121b a distance from the inner peripheral edge 118. The distance from the inner peripheral edge 118 is up to less than about 90% of the length of the housing 110. The front surface of the RF hot electrode is spaced from the front face of the housing 110 to form a first gap 116a. The outer RF hot electrode 120b has a first end 121c spaced a distance from the outer peripheral edge 119 less than about 90% of the length of the housing 110 and a second end 121d adjacent the outer peripheral edge 119 of the housing 110. The front surface of the outer peripheral region is spaced a distance from the front face forming a second gap 116b. While each region can comprise up to about 90% of the length of the housing, the regions do not touch.

The first gap 116a and the second gap 116b can be different or the same. In some embodiments, the first gap 116a is different from the second gap 116b in the range of about 0.1 mm to about 10 mm, or up to about 10 mm with either the first gap or second gap being larger. Again, it will be understood that where there are more than two regions to the RF hot electrode, there can be more than two gaps, with each independently sized relative to the other gaps.

Figure 8:
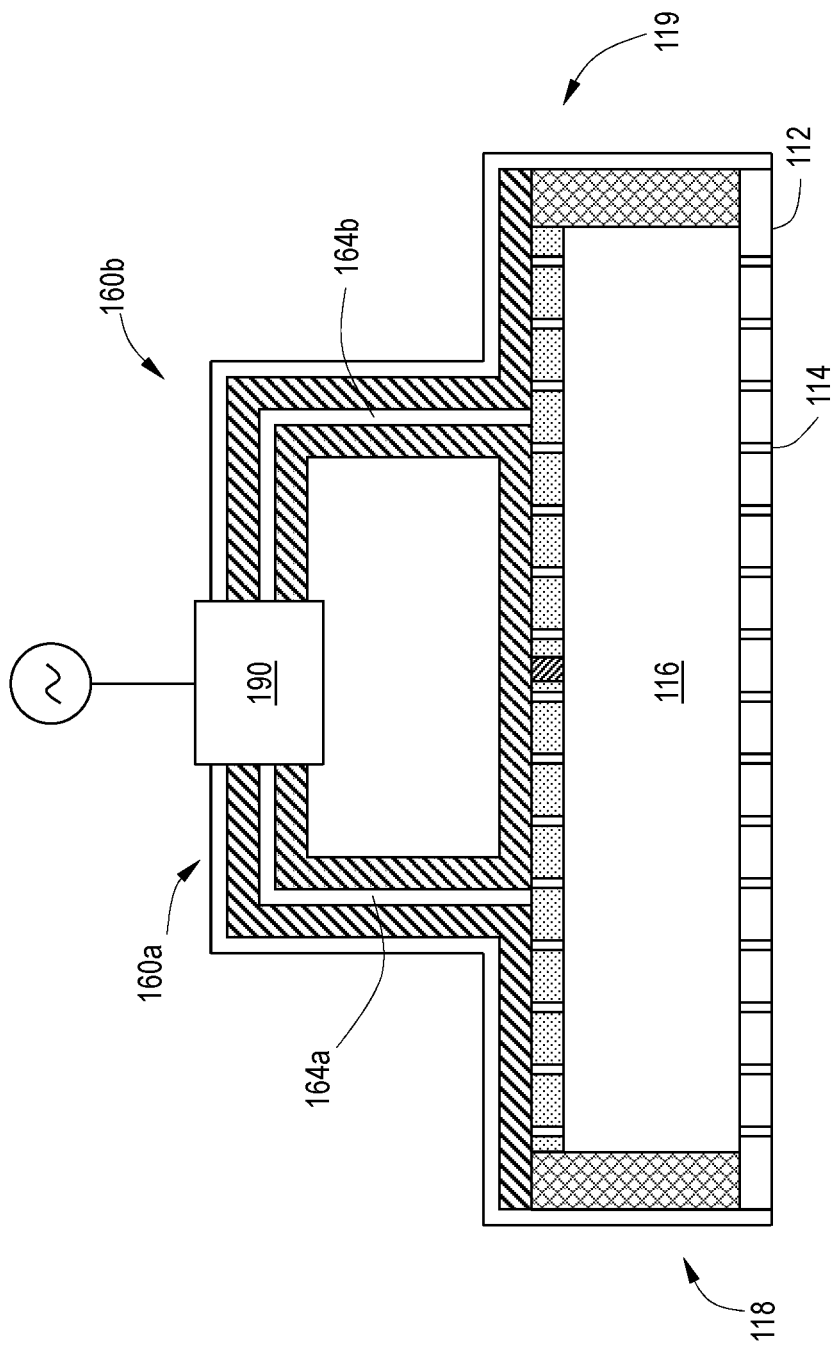
FIG. 8 shows a cross-sectional view of a plasma source assembly in accordance with one or more embodiments of the disclosure.

Referring to FIG. 8, in one or more embodiments, the junction comprises a controller 190. The controller 190 can modify one or more of the power and/or phase of the incoming RF. When modifying the power, the controller 190 generates a first RF power in the first coaxial RF feed line and a second RF power different from the first RF power in the second coaxial RF feed line. When modifying the phase, the controller 190 generates a first phase in the first coaxial RF feed line and a second phase different from the first phase in the second coaxial RF feed line.

In other embodiments, each of the coaxial feed lines has a separate power source. For example, a plasma source assembly having three RF hot electrode sections can have two or more power sources. If two sources are used, the RF from one source can be split in accordance with the embodiments of, for example, FIG. 4 or 6.

Figure 9:
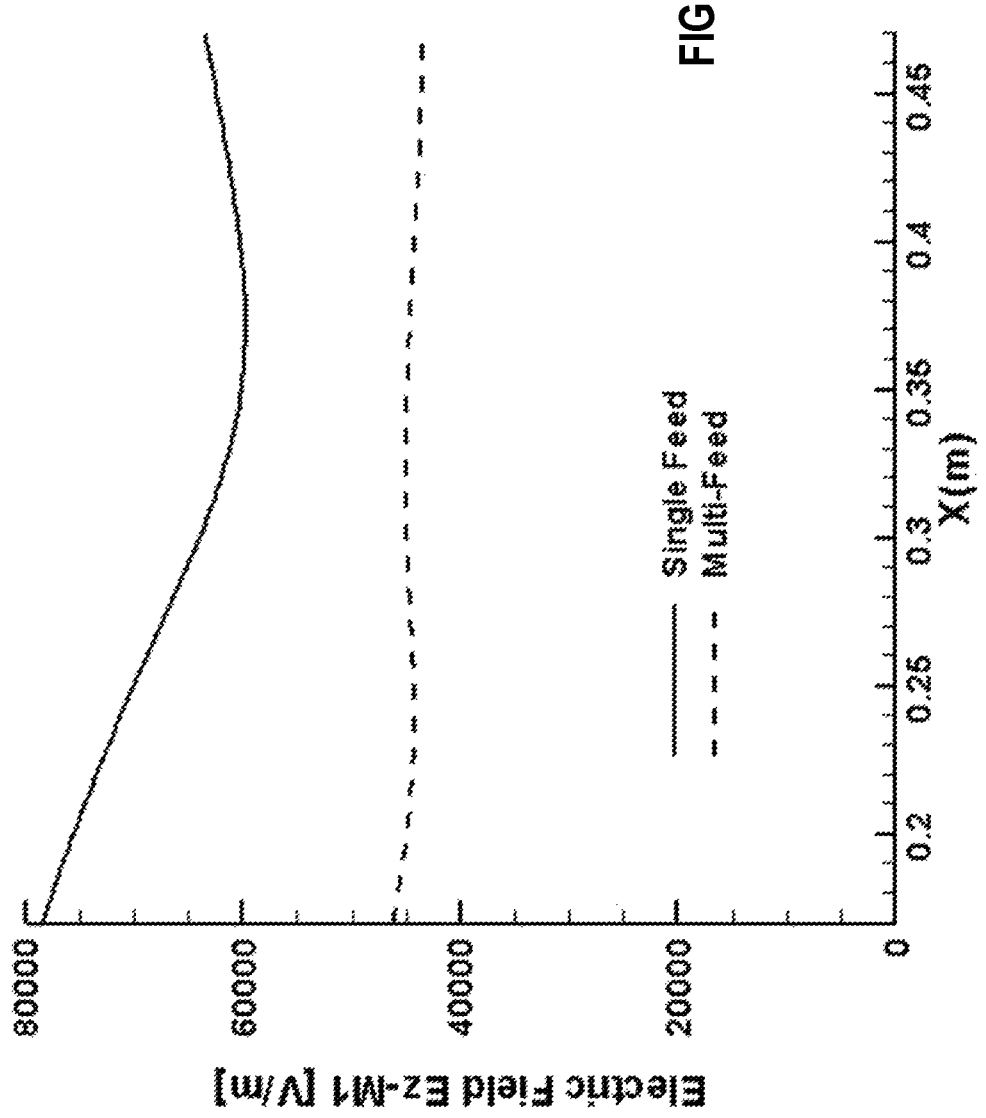
FIG. 9 shows a graph of the electric field as a function of distance from the inner peripheral edge of a plasma source assembly for single feed and multi-feed assemblies in accordance with one or more embodiments of the disclosure.

According to one or more embodiments, splitting the RF to multiple points on a single hot electrode or to separate hot electrodes improves electric field uniformity and hence the species flux uniformity along the length of the plasma region. FIG. 9 shows a graph of the electric field as a function of distance along the length of the hot electrode. The multi-feed electrode has two RF connections from a split-feed system with the connections occurring about ⅓ and about ⅔ of the length of a wedge-shaped hot electrode. It can be seen that the single feed has a high electric field and variability while the multi-feed source shows lower electric field strength than a single RF feed connection. However, the multi-feed system has a much more uniform electric field, and hence species flux along the length of the plasma region.

Figure 10A:
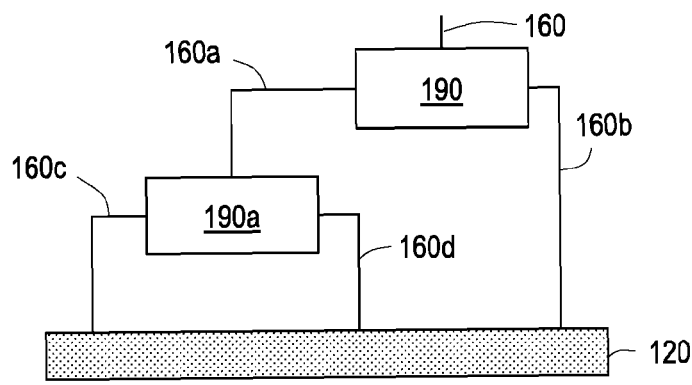
FIG. 10A shows a schematic representation of a plasma source assembly in accordance with one or more embodiments of the disclosure.

FIG. 10A shows another embodiment in which a coaxial RF feed line 160 is split into three separate feeds 160b, 160c, 160d which connect to the RF hot electrode 120. The coaxial RF feed line 160 is shown in communication with controller 190 but it will be understood that a controller is not necessary. The controller 190 can be any suitable controller that can split the RF by power and/or phase. Exiting the controller 190, RF feed line 160a enters a second controller 190a and RF feed line 160b is connected to the RF hot electrode 120. The length of the RF feed line 160a and RF feed line 160b can be the same or different. The second controller 190a is any suitable controller that can separate RF from RF feed line 160a by one or more of power and phase into RF feed line 160c and RF feed line 160d. Each of RF feed line 160c and RF feed line 160d connect to the RF hot electrode 120 at different points and the length of RF feed line 160c and RF feed line 160d can be the same or different.

Figure 10B:
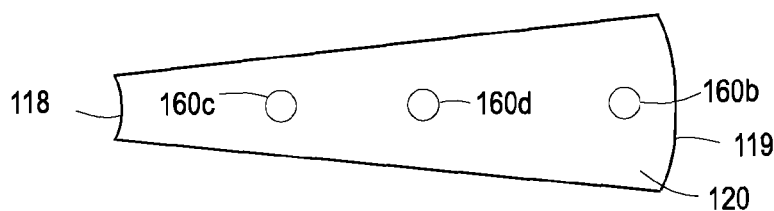
FIGS. 10B through 10D show schematic top plan views of a plasma source assembly in accordance with the embodiment of FIG. 10A.
Figure 10C:
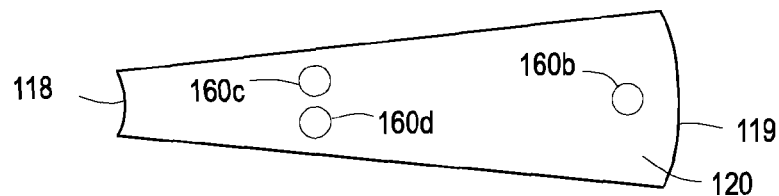
Figure 10D:
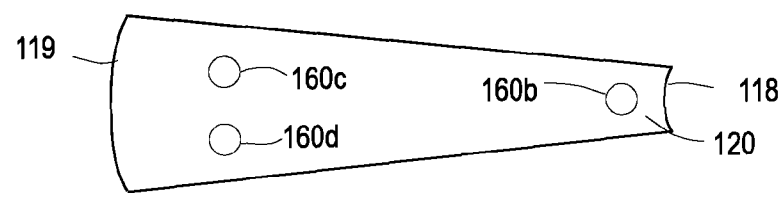

FIGS. 10B through 10D show plan views of some exemplary RF hot electrodes with three RF feed lines 160b, 160c and 160d connected thereto. In FIG. 10B, each of the RF feed lines connect to the hot electrode at about the center of the width of the electrode. FIG. 10C shows another embodiment in which one of the RF feed lines 160b connects near the middle of the width of the electrode near the wider end of the wedge. The other RF feed lines 160c, 160d connect to the RF hot electrode 120 near the inner peripheral edge 118 and are spaced about equidistant from the middle of the width of the electrode. While FIG. 10C shows the two RF fee lines 160c, 160d spaced equidistant from the middle, it will be understood that the positions do not need to be equidistant. FIG. 10D shows another embodiment similar to that of FIG. 10C but with the opposite orientation so that the RF feed lines 160c, 160d are positioned adjacent the outer peripheral edge 119 and spaced about equidistant from the middle of the width of the electrode.

Figure 11A:
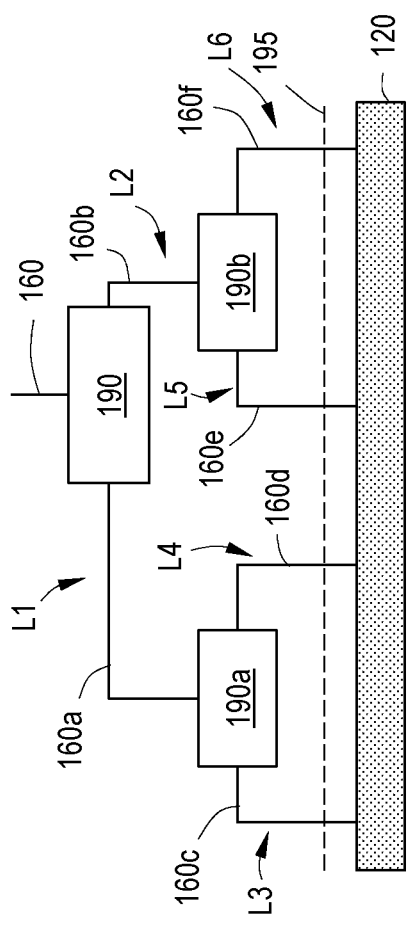
FIG. 11A shows a schematic representation of a plasma source assembly in accordance with one or more embodiments of the disclosure.

FIG. 11A shows another embodiment of an embodiment in which a coaxial RF feed line 160 is split into a total of four separate feeds 160c, 160d, 160e, 160f which connect to the RF hot electrode 120. The coaxial RF feed line 160 is shown in communication with controller 190, however, it will be understood that a controller is not necessary. The controller 190 can be any suitable controller that can split the RF by one or more of power or phase so that one or more of different power or different phase are exiting the controller. In some embodiments, the controller 190 can split the RF by one or more power and phase so that the RF feed line 160a and RF feed line 160b have different powers and phases. Exiting the controller 190, RF feed line 160a has a first length L1 and enters a second controller 190a and RF feed line 160b has a second length L2 and enters a third controller 190c. The first length L1 of the RF feed line 160a and the second length L2 of RF feed line 160b can be the same or different. In the embodiment shown, the first length L1 of the RF feed line 160a is about twice that of the second length L2 of RF feed line 160b. The second controller 190a is any suitable controller that can separate RF from RF feed line 160a by one or more of power or phase, or by one or more power and phase, into RF feed line 160c with a third length L3 and RF feed line 160d with a fourth length L4. Each of RF feed line 160c and RF feed line 160d connect to the RF hot electrode 120 at different points and the length of RF feed line 160c and RF feed line 160d can be the same or different. The third controller 190b is any suitable controller that can separate RF from RF feed line 160b by one or more of power or phase, or by one or more power and phase, into RF feed line 160e with a fifth length L5 and RF feed line 160f with a sixth length L6. Each of RF feed lines 160e and RF feed line 160f connect to the RF hot electrode 120 at different points and the length of the RF feed line 160e and RF feed line 160f can be the same or different.

Figure 11B:
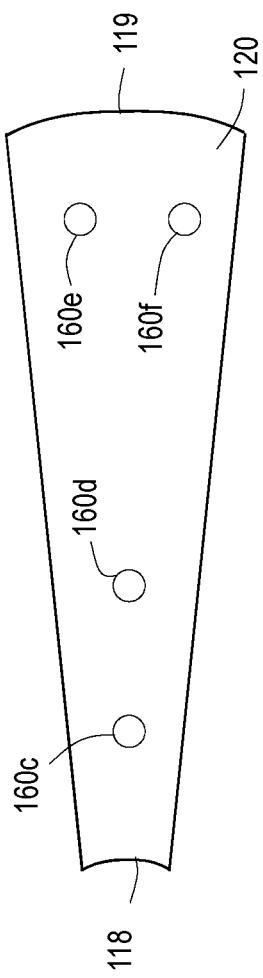
FIG. 11B shows a schematic top plan view of a plasma source assembly in accordance with the embodiment of FIG. 11A.

FIG. 11B shows a plan view of an exemplary RF hot electrode 120 with four RF feed lines 160c, 160d, 160e and 160f in accordance with FIG. 11A. This is merely one possible configuration and should not be taken as limiting the scope of the disclosure. In FIG. 11B, RF feed line 160c is connected to the RF hot electrode 120 at a position adjacent the inner peripheral edge 118 at about the middle of the width of the electrode. As used in this specification and the appended claims, the term "adjacent" means next to, near or relatively close to the subject component. The RF feed line 160d is connected to the RF hot electrode 120 on the side of the RF feed line 160c closer to the outer peripheral edge 119 of the RF hot electrode 120. The RF feed line 160e and RF feed line 160f are positioned adjacent the outer peripheral edge 119 of the electrode 120 and spaced about equidistant from the middle of the width of the electrode.

Figure 12A:
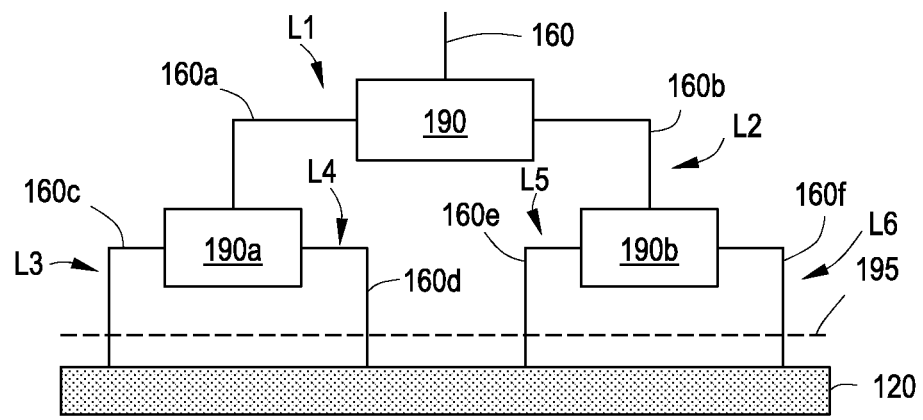
FIG. 12A shows a schematic representation of a plasma source assembly in accordance with one or more embodiments of the disclosure.
Figure 12B:
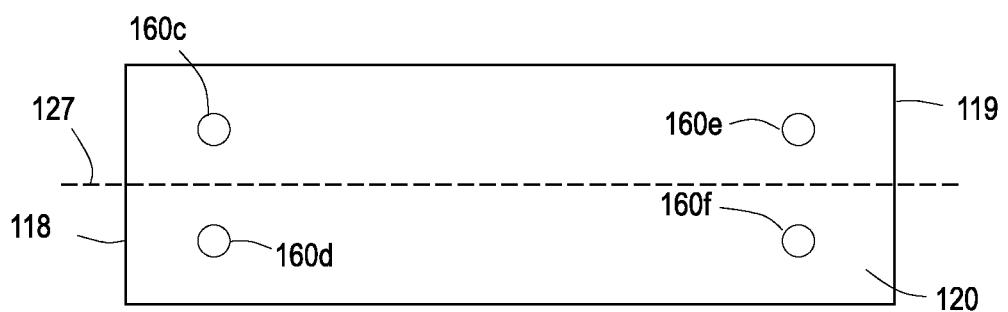
FIG. 12B shows a schematic top plan view of a plasma source assembly in accordance with the embodiment of FIG. 12A.

FIGS. 12A and 12B show another embodiment of the disclosure in which the RF hot electrode 120 is rectangular in shape. The terms inner peripheral edge 118 and outer peripheral edge 119 are not particularly meaningful for this embodiment but are used merely to show relative position. For this embodiment, the outer and inner edges are used for naming purposes only and should not be taken as limiting the scope of the disclosure. Here, an RF feed line 160 is connected to a controller 190 which splits the signal into RF feed line 160a having a first length L1 and RF feed line 160b having a second length L2. The length of RF feed line 160a and RF feed line 160b are substantially the same. As used in this regard, "substantially the same" means that any difference in length does not affect the uniformity of the resulting electron flux by more than 10%. The RF feed line 160a connects to controller 190a which splits the feed into RF feed line 160c having a third length L3 and RF feed line 160d having a fourth length L4. The third length L3 and fourth length L4 are substantially the same so that the distances from the controller 190a to the RF hot electrode 120 are substantially the same. The RF feed line 160b connects to controller 190b which splits the feed into RF feed line 160e having a fifth length L5 and RF feed line 160f having a sixth length L6. The fifth length L5 and the sixth length L6 are substantially the same so that the distance from the controller 190b to the RF hot electrode is substantially the same. The RF feed line 160c and RF feed line 160d connect to the RF hot electrode at positions adjacent the inner peripheral edge 118 and about equidistant from the middle 127 of the width of the electrode 120. The RF feed line 160e and RF feed line 160f connect to the RF hot electrode at positions adjacent the outer peripheral edge 119 and equidistant from the middle 127 of the width of the electrode 120.

Figure 13:
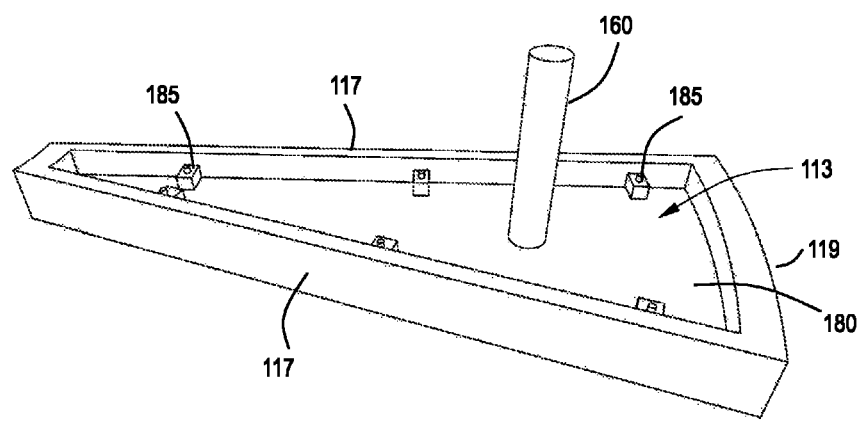
FIG. 13 shows a partial perspective view of a wedge-shaped plasma source assembly in accordance with one or more embodiments of the disclosure.

FIG. 13 shows a perspective view of the top portion of a wedge-shaped plasma source assembly 100. The coaxial RF feed line 160 can connect to any suitable portion of the assembly 100 to provide a uniform electric field across the RF hot electrode 120. In the embodiment shown in FIG. 13, the coaxial RF feed line 160 connects to the RF hot electrode at a point between the elongate sides 117 but closer to the outer peripheral edge 119 than the inner peripheral edge 118. The point of connection can be, for example, a center of mass of the RF hot electrode 120, or a portion of the device in which the current density across the RF hot electrode 120 is substantially uniform.

The embodiment shown in FIG. 13 excludes a top so that the gas volume 113 and the top of the grounded plate 180 can be seen. Additionally, the compression elements 185 which provide directed force to the back side of the grounded plate 180 can be seen. These compression elements 185 are shown in the gas volume 113, but it will understood that this is merely one possible configuration and that the compression elements 185 can be isolated from the gas volume 113. While no holes are shown through the electrode, it will be understood that there can be a plurality of holes in the electrode to allow the gas in the gas volume 113 to pass through the electrode.

Figure 14:
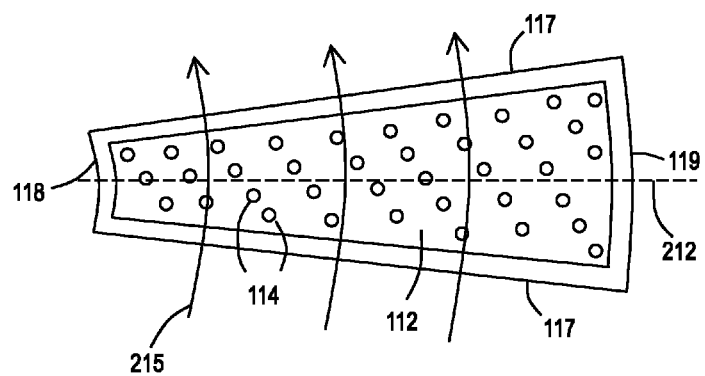
FIG. 14 shows a front view of a wedge-shaped plasma source assembly in accordance with one or more embodiments of the disclosure.

FIG. 14 shows a front view of another embodiment of a wedge-shaped plasma source assembly 100. Here, the arrangement of plurality of apertures 114 can be seen. In the embodiment shown, the apertures 114 are evenly distributed in rows which are angled relative to the central axis 212 of the front face 112. Stated differently, the front face 112 of the housing 110 has a plurality of apertures 114 which form a hole pattern that is rotated at an angle relative to the elongate axis (central axis 212) of the housing. The direction of movement of the wafer across the surface of the plasma source assembly is shown with arrows 215. The line of apertures 114 can be angled relative to the central axis 212 so that any given point on the surface of the substrate does not "see" a line of apertures as it traverses the plasma source. This may provide a more uniform plasma exposure without striping evident in the final product.

Rotation of the carousel can be continuous or discontinuous. In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where it can pause again. Pausing between the injectors may provide time for additional processing steps between each layer deposition (e.g., exposure to plasma).

The frequency of the plasma may be tuned depending on the specific reactive species being used. Suitable frequencies include, but are not limited to, 2 MHz, 13.56 MHz, 40 MHz, 60 MHz and 100 MHz.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the desired separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. The details of one such staged-vacuum substrate processing apparatus are disclosed in U.S. Pat. No. 5,186,718, entitled "Staged-Vacuum Wafer Processing Apparatus and Method," Tepman et al., issued on Feb. 16, 1993. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

During processing, the substrate can be heated or cooled. Such heating or cooling can be accomplished by any suitable means including, but not limited to, changing the temperature of the substrate support (e.g., susceptor) and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

While the foregoing is directed to embodiments of the present disclosure, other and further embodiments of the disclosure may be devised without departing from the basic scope thereof, and the scope thereof is determined by the claims that follow.

What is claimed is:

1. A plasma source assembly comprising:
a housing having an inner edge, an outer edge and side walls, the housing including an electrically grounded front face, the inner edge and outer edge defining a length and the side walls defining a width, the electrically grounded front face including holes to allow a gas to pass therethrough;
an RF hot electrode within the housing spaced from the electrically grounded front face and defining a gap, the RF hot electrode including a plurality of holes to allow a gas to pass therethrough;
a first coaxial RF feed line including an outer conductor and an inner conductor separated by an insulator, the outer conductor in electrical communication with electrical ground and the inner conductor in electrical communication with the RF hot electrode, the first coaxial RF feed line connecting to the RF hot electrode at a first distance from the inner edge of the housing; and
a second coaxial RF feed line including an outer conductor and an inner conductor separated by an insulator, the outer conductor in electrical communication with electrical ground and the inner conductor in electrical communication with the RF hot electrode, the second coaxial RF feed line connecting to the RF hot electrode at a second distance from the inner edge of the housing, the second distance being greater than the first distance.

2. The plasma source assembly of claim 1, wherein an RF feed line connected to a power source, the RF feed line splitting into the first coaxial RF feed line and the second coaxial RF feed line at a junction.

3. The plasma source assembly of claim 2, wherein the junction is closer to one of the first coaxial RF feed line and the second coaxial RF feed line than the other of the first coaxial RF feed line and the second coaxial RF feed line so that the first coaxial RF feed line has a first length and the second coaxial RF feed line has a second length.

4. The plasma source assembly of claim 3, wherein a ratio of the first length to the second length is in the range of about 10:1 to about 1:5.

5. The plasma source assembly of claim 2, wherein the junction comprises a controller.

6. The plasma source assembly of claim 5, wherein the controller modifies RF power from the RF feed line to generate a first RF power in the first coaxial RF feed line and a second RF power different from the first RF power in the second coaxial RF feed line.

7. The plasma source assembly of claim 5, wherein the controller modifies RF phase to generate a first phase in the first coaxial RF feed line and a second phase different from the first phase in the second coaxial RF feed line.

8. The plasma source assembly of claim 2, further comprising a third coaxial RF feed line including an outer conductor and an inner conductor separated by an insulator, the outer conductor in electrical communication with electrical ground and the inner conductor in electrical communication with the RF hot electrode, the third coaxial RF feed line connecting to the RF hot electrode at a third distance from the inner edge of the housing, the third distance being different than the first distance or the second distance.

9. The plasma source assembly of claim 8, wherein the first coaxial RF feed line, the second coaxial RF feed line and the third coaxial RF feed line connect to the RF hot electrode at about a center of a width of the RF hot electrode.

10. The plasma source assembly of claim 8, wherein the junction comprises a controller and each of the first coaxial RF feed line, the second coaxial RF feed line and the third coaxial RF feed line are connected to the controller.

11. The plasma source assembly of claim 10, wherein the controller modifies RF power from the RF feed line to generate a first RF power in the first coaxial RF feed line and a second RF power different from the first RF power in the second coaxial RF feed line.

12. The plasma source assembly of claim 1, further comprising a first power source connected to the first coaxial RF feed line and a second power source connected to the second coaxial RF feed line.

13. The plasma source assembly of claim 1, wherein the RF hot electrode is separated into an inner region and an outer region, the inner region electrically isolated from the outer region by a dielectric material.

14. The plasma source assembly of claim 13, wherein the dielectric material is selected from the group consisting of ceramic, aluminum oxide, aluminum nitride, plastic and combinations thereof.

15. The plasma source assembly of claim 1, further comprising an end dielectric bounding the RF hot electrode at the inner edge, the outer edge and the side walls positioned between the RF hot electrode and the housing.

16. The plasma source assembly of claim 15, wherein the end dielectric comprising a material selected from the group consisting of ceramic, aluminum oxide, aluminum nitride, plastic and combinations thereof.

17. The plasma source assembly of claim 1, wherein the gap is in the range of about 2 mm to about 25 mm.

18. The plasma source assembly of claim 1, wherein the first coaxial RF feed line and the second coaxial RF feed line are connected to electrical ground so that there is symmetric geometry of return current.

19. The plasma source assembly of claim 1, wherein the plurality of holes in the RF hot electrode have a diameter less than about 2 mm.

20. The plasma source assembly of claim 1, wherein the holes in the front face have a diameter less than about 7 mm.

* * * * *